United States Patent [19]

Wieczorek

[11] Patent Number: 5,192,919
[45] Date of Patent: Mar. 9, 1993

[54] TRANSMITTER HAVING A TEMPERATURE ADJUSTED POWER AMPLIFIER

[75] Inventor: Alfred B. Wieczorek, Plantation, Fla.

[73] Assignee: Motorola, Inc., Schaumburg, Ill.

[21] Appl. No.: 770,392

[22] Filed: Oct. 3, 1991

[51] Int. Cl.[5] .............................................. H03G 3/20
[52] U.S. Cl. ................................. 330/129; 330/289; 455/127
[58] Field of Search ............... 330/127, 129, 279, 289, 330/297; 455/67, 127, 343

[56] References Cited

U.S. PATENT DOCUMENTS 4,380,089  4/1983  Weir .................................. 455/127

Primary Examiner—Steven Mottola
Attorney, Agent, or Firm—Robert S. Babayi

[57] ABSTRACT

A battery powered transmitter (330) is provided which includes a power amplifier (332) having controllable output power and current drain, a temperature sensor (300) and a controller (309). The output power of the power amplifier (332) is reduced when the ambient temperature drops below a predetermined threshold in order to reduce current drain from a battery (350) in cold temperatures.

6 Claims, 1 Drawing Sheet

TRANSMITTER HAVING A TEMPERATURE ADJUSTED POWER AMPLIFIER

BACKGROUND OF THE INVENTION

This invention pertains to the field of transmitters and in particular to transmitters which are used in a battery-powered communication devices.

Battery-operated communication devices, such as cellular telephones or portable two-way radios, are extensively used for aerial transmission of communication messages to other communication devices within a communication system. Such communication devices include transmitters having modulating circuitry for communication messages as well as a power amplifier for amplifying the modulated signals before transmission through an antenna.

Frequency modulated (FM) transmitters are conventionally used in a variety of communication devices. An FM transmitter generally includes a class C power amplifier which provides a constant output power when modulated, thus drawing a constant current from its battery. The class C power amplifiers provide higher efficiency at increased distortion which, as is well known in the prior art, does not significantly affect system performance in FM applications.

However, newly developed, time division, multiplexed (TDM) communication systems utilize linear modulation techniques, such as QPSK, or Quad QAM, rather than frequency modulation. A linear modulator requires highly distortionless power amplifiers for transmission of the communication signals. Generally, in these applications, class AB type power amplifiers are used which, as a result of operating below the saturation region, are less efficient than class C type amplifiers. The AB type amplifiers provide non-constant output power which may have a variance in transmitter output ranging from 3 dB to 7 dB. Thus, current drain from the battery is also non-constant and may reach peak points when maximum power is being delivered by the power amplifier.

Generally, a battery power supply performs best at room temperature by presenting a low impedance which allows optimum current to be delivered to the communication device. However, as the temperature decreases, a higher impedance is presented which, under heavy load currents, limits the voltage that can be supplied to the communication device. The inefficient peak current drain situations encountered using class AB type power amplifiers, therefore, may degrade performance of the communication device at low temperatures and cause spurious transmission failures.

Currently, power amplifiers are protected from excessive heat by reducing the output power when the ambient temperature exceeds a predetermined level. However, this approach is aimed at protecting the power amplifier and does not address the problem of energy delivering capability of the battery at very low temperatures.

In many systems it has been recognized that it is not necessary for a communication device to continuously transmit at maximum capable power. This recognition has been the basis for concepts such as "Turbo Power," where the communication device initially operates at less than full power, then increases it when needed. However, this approach also does not consider the effect of temperature on the energy-delivering capability of the battery supply.

SUMMARY OF THE INVENTION

According to the invention, a power amplifier system for a transmitter is provided which includes a power amplifier having a controllable output power, a temperature sensor for generating a temperature signal proportional to the ambient temperature, and the controller which is responsive to the temperature signal for reducing the output power when the ambient temperature drops below a predetermined level.

DESCRIPTION OF THE PREFERRED EMBODIMENTS

Figure 1:
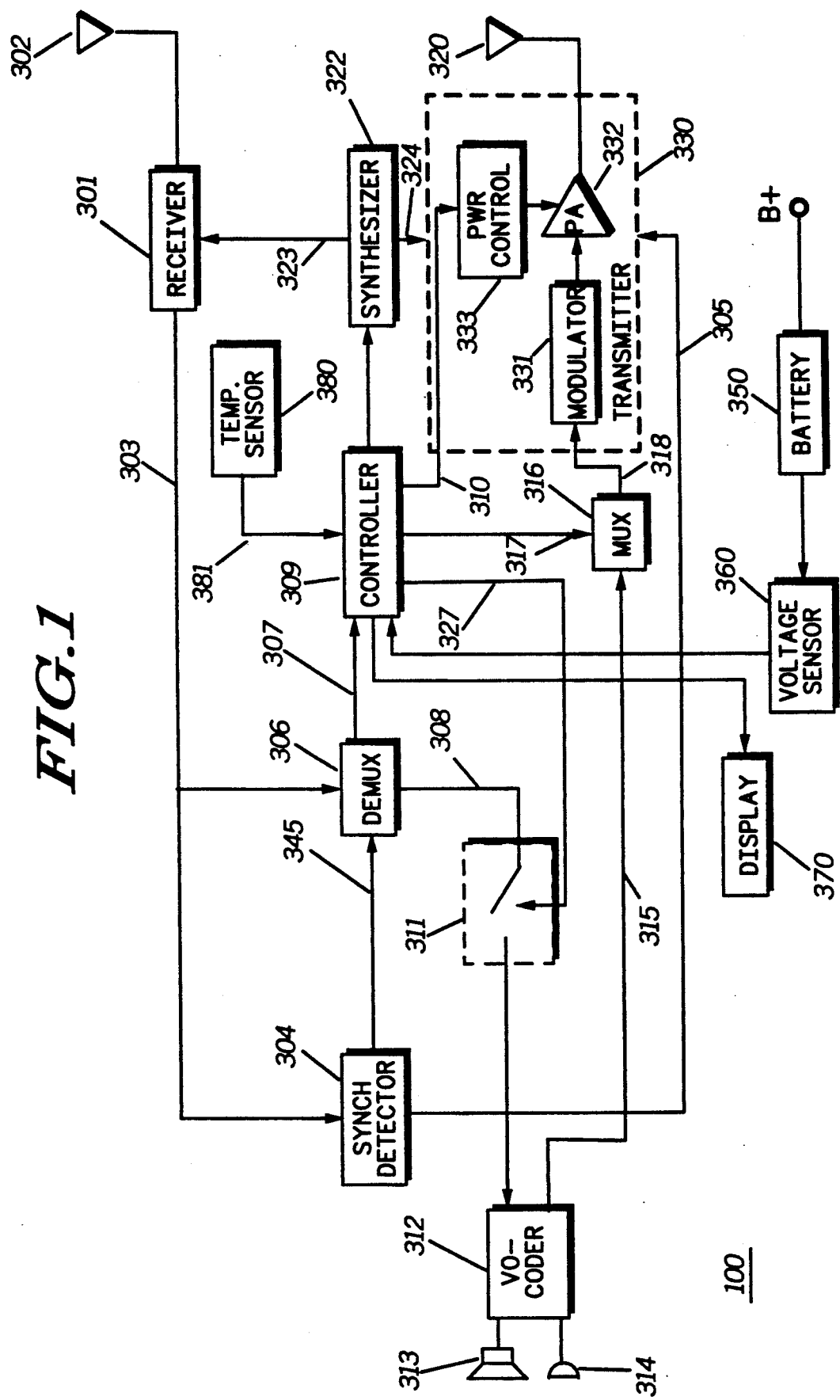
FIG. 1, is a block diagram of a communication device which includes a transmitter according to the present invention.

Referring to FIG. 1, a block diagram of a communication device 100 is shown to describe the principles of the present invention. The communication device 100 comprises a time division multiplexed (TDM) portable radio which, as will be described later in detail, includes receiver and transmitter circuitry for communicating messages within a communication system. One such communication system comprises a cellular digital communication system, such as the IRIDIUM TM system offered by Motorola, Inc., in which the communication device 100 operates as a subscriber unit. The communication device 100 receives its energy supply from a battery 350 which provides B+ potential to the receiver and to the transmitter circuitry. A TDM communication device, such as communication device 100, receives messages on one or more frequency channels which are divided into repetitive receive or transmit time slots. The communication device 100 receives messages during a "receive time" slot and transmits messages during a "talk time" slot.

The communication device 100 includes a well-known TDM receiver 301 that couples to an appropriate antenna 302 to receive RF signals and provide a recovered information signal 303. The recovered information signal includes both control data information and voice information which are communicated within the communication system. The control information is used by the communication device 100 to operate in an orderly fashion within the communication system. The voice information is the audio message that is communicated by a user within the communication system. The recovered information signal 303 is applied to a synchronization detector 304 which provides a synchronization signal 345. The synchronization signal 345 is used to establish frame and bit synchronization needed to recover the control and the voice information. The synchronization signal 345 is applied to a demultiplexer 306 so as to retrieve control data 307 and the voice data 308 embedded within the recovered information signal 303. The control data 307 is applied to a controller 309 for further processing. A switch 311 under the control of the controller 309 applies the voice data 308 to a voice coder (vo-coder) 312. The controller 309 controls the switch 311 by applying an interrupt signal 327 to open or close the switch 311. The vo-coder 312 provides the required coding/decoding function used in this embodiment to properly encode (or decode) the audio information in a particular form. The vo-coder 312 also routes decoded signals to an appropriate speaker 313 to be rendered audible.

Audio signals to be transmitted are routed from a microphone 314 to the vo-coder 312 for processing. The processed audio information is in the form of digital information audio data 315. The audio data 315 is applied to a multiplexer 316 which appropriately adds other control information 317 to the audio data 315 and provides the TX signal 318. The TX signal 318 is applied to a well-known TDM transmitter 330 (shown in a dotted box) which is synchronized by a synchronization signal 305 as provided by the synchronization detector 304. The TDM transmitter uses the synchronization signal 305, which is derived from the RX signal 303, to establish a constant timing relationship between the RX signal 303 and the TX signal 318. This timing relationship is specific as a part of a particular communication protocol and thus, would be known to both the communication device 100 and other communication devices within the communication system.

The transmitter 330 includes a modulator 331 which modulates the TX signal 318 using one of a number of suitable linear modulation schemes. The modulator 331 provides a linearly-modulated signal 334 which is applied to a power amplifier 332 for amplification. In order to support linear modulation, the power amplifier 332 comprises a well known class AB power amplifier having controllable output power. The output power of the power amplifier 332 is controlled by a well-known power controller 333 which which may be programmed to set the output power of the power amplifier 332 by the controller 309. The power controller 333 is responsive to a control signal 310 generated by the controller 309 to set the output power of the power amplifier 332. In this way, the output power of the power amplifier 332 may be adjusted from a minimum output power to a maximum output power. As is well known in the art, the output power and the power amplifier 332 may be controlled by either controlling the input drive or by controlling the amplifier bias.

Ultimately, a properly coded, modulated, and amplified transmission signal is transmitted via an antenna 320. It may be appreciated that antennas 302 and 320 may be replaced by a single antenna and an antenna switch which is controlled by the controller 309 to selectively couple the TDM transmitter 319 and the TDM receiver 301 to the single antenna. Alternately, a duplexer could be used in place of the antenna switch and/or the antennas as is known in the art.

The controller 309 is the heart of the communication device 100 and 304 controls its overall operation. The controller provides frequency data 321 for programming a synthesizer 322. The synthesizer 322 produces the receiver and transmitter frequency local oscillator signals 323 and 324. Accordingly, the TDM receiver 301 and the TDM transmitter 324 may be used to receive or transmit on a particular frequency under the control of the controller 309. The controller 309 may comprise any well-known microcontroller, such as MC68HC11 ™ manufactured by Motorola Inc. Alternatively, the controller may be a part of a digital signal processor, such as DSP 56156 manufactured by Motorola, which also implements the vo-coder 312. The communication device 100 includes a temperature sensor 380 which provides a temperature signal 381 corresponding to the ambient temperature. The temperature signal is applied to the controller 309 for processing. Additionally, the controller 309 receives the output of a voltage sensor 360 which is coupled to the battery 350 to sense the voltage across its terminals. The communication device 100 includes a well-known display 370 which is coupled to the controller 309 to visually inform the user of the various parameters and/or activation of device features or any other relevant information.

Operationally, during receive time, the receiver circuitry become operational and the communication device draws a receiver current of approximately 650 mA from the battery 350. As is well known in the art, class AB power amplifiers provide a non-constant output power which causes a non-constant current to be drawn from the battery 350. Consequently, during talk time, the battery 350 supplies a substantially larger average transmit current, i.e., in the range of 5650 mA, to the transmitter circuitry when the power amplifier is adjusted to provide the maximum output power. As is also well known in the art, the current needed from the battery 350 during talk time is proportional to the output power. That is, the higher the output power the more current is needed from the battery and vice versa.

The battery 350 comprises a well-known battery which includes rechargeable cells coupled in series to provide the B+ supply voltage. One such rechargeable cell comprises a lithium-ion cell which is capable of providing substantial energy in a significantly small package. Each lithium-ion cell is capable of providing 4.5 V of supply voltage. Generally, under specified load conditions, batteries perform best at room temperatures by providing optimum current and supply voltage. However, under heavy load, their impedance will limit their supply voltage. This condition is more pronounced at low temperatures where cell impedance can increase by over one hundred percent. Applicant's experiments have shown the dramatic effect of cold temperature on energy supply capability of a lithium-ion battery cell. The Applicant's experiments provided for repetitious cycles of first drawing 5650 mA corresponding to current at maximum output power from the battery for 280 ms. Subsequently, the current was reduced to 650 mA (corresponding to receive time current), which was drawn for 5.72 seconds. As the cycles were repeated, the time elapsed for the battery supply voltage to first reach 3 volts and then to 2.5 volts was measured. At room temperature, the supply voltage of the battery cell reached 3 volts in 96 minutes and after further discharge the supply voltage reached 2.5 volts in 120 minutes. However, at −20 degrees C. and under the same load condition, the supply voltage dropped to 3 volts in only 1.1 minutes and to 2.5 volts in 10 minutes. Due to increased impedance at cold temperature (−20 degrees C.), the battery cell's supply capability was, therefore, degraded by almost 100 times.

According to the Applicant's experiment, the high current drawn from the battery at maximum output power severely degrades the communication device's performance at cold temperatures, therefore, not allowing it to transmit messages effectively during talk time.

In many communication systems, it is not necessary for the radio to transmit at maximum capable output power; communication may be established by substantially lowering the output power. According to the invention, the output power of the power amplifier 332 is reduced when the ambient temperature drops below a predetermined threshold, thereby reducing the current needed from the battery at cold temperatures. Experiments show that by dropping the output power by 3 dB, the time elapsed for the supply voltage to reach 3.0 volts is extended to more than ten minutes.

Operationally, the temperature signal 381 as generated by temperature sensor 380, is processed by the controller 309 to determine whether the ambient temperature is dropped below this predetermined level. Once the ambient temperature drops below this predetermined level, the controller 309 generates an appropriate setting on the control signal 310 which is applied to the power control 333 to decrease the output power. The output power is sufficiently decreased to reduce the current drawn from the battery 350, thereby extending its energy supply capability.

Furthermore, the decision to control the output power may be dependent on the voltage across the battery 350 due to deletion, as well as the ambient temperature. In this arrangement, after the determination is made as to the ambient temperature, the voltage across the battery may also be checked to finely adjust the output power. For example, if the ambient temperature drops below the predetermined level, depending on the voltage across the battery 350, the decision may be made as to whether to reduce the output power, and if so, by how much. Therefore, the controller 309, in addition to processing to the temperature signal, may also be responsive to the voltage across the battery as provided by the voltage sensor 360 to adjust the output power. Alternatively, the decision to reduce the output power based on ambient temperature may be dependent on whether the voltage across the battery has dropped below a predetermined level. That is, the output power at cold temperatures would not be reduced unless the voltage across the battery drops below a predetermined level. This feature would prevent the premature reduction of output power when the battery is still capable of providing the needed energy.

Accordingly, as described above, reducing the output power of the transmitter at cold temperatures according to the present invention may increase energy-delivering capability of the battery by ten times. This improvement is, of course, achieved by a trade off in communication capability of the communication device 100. However, in the majority of system applications, such a trade off is insignificant because of the coverage arrangement provided by the communication system.

I claim as my invention:

1. A linear power amplifier system for a transmitter, comprising:
  a linear power amplifier for amplifying a transmission signal having a power control means for controlling output power and current drain of the power amplifier; wherein amplification of said transmission signal causes the power amplifier to have a non-constant current drain;
  a temperature sensor for generating a temperature signal corresponding to the ambient temperature;
  a controller responsive to the temperature signal for reducing the output power when the ambient temperature drops below a predetermined level; a battery for providing the supply current for the power amplifier; and
  a voltage sensor coupled to the battery for sensing battery voltage, wherein the controller is responsive to the voltage sensor for adjusting the output so as to maintain the battery voltage above a predetermined threshold at cold temperatures.

2. The power amplifier of claim 1, wherein the controller reduces the output power only after the battery voltage has dropped below a predetermined level.

3. A transmitter, comprising:
  a linear power amplifier for amplifying a modulated transmission signal having a power control means for controlling output power of the power amplifier; wherein amplification of said modulated transmission signal causes the power amplifier to have a nonconstant current drain;
  a battery for providing supply current for the power amplifier;
  a voltage sensor coupled to the battery for sensing battery voltage,
  a temperature sensor for generating a temperature signal corresponding to the ambient temperature; and
  a controller responsive to the temperature signal and the battery voltage for reducing the output power when the ambient temperature drops below a predetermined level so as to maintain battery voltage above a threshold level at cold temperatures.

4. The power amplifier of claim 3, wherein the controller reduces the output power after the battery voltage has dropped below a predetermined level.

5. A communication device for communicating messages within a communication system, comprising:
  a battery for providing supply current for the communication device;
  a voltage sensor coupled to the battery for sensing battery voltage,
  a transmitter for transmitting the messages including:
  a linear power amplifier for amplifying a modulated transmission signal having a power control means for controlling output power of the power amplifier; wherein amplification of said modulated transmission signal causes the power amplifier to have a nonconstant current drain;
  a temperature sensor for generating a temperature signal corresponding to the ambient temperature; and
  a controller responsive to the temperature signal and the battery voltage for reducing the output power when the ambient temperature drops below a predetermined level so as to maintain battery voltage above a threshold level at cold temperatures.

6. The power amplifier of claim 5, wherein the controller reduces the output power after the battery voltage has dropped below a predetermined level.

* * * * *

UNITED STATES PATENT AND TRADEMARK OFFICE
CERTIFICATE OF CORRECTION

PATENT NO. : 5,192,919
DATED : March 9, 1993
INVENTOR(S) : Alfred B. Wieczorek

It is certified that error appears in the above-identified patent and that said Letters Patent is hereby corrected as shown below:

Column 6, line 6, at the end of the line, after "output" insert --power --.

Signed and Sealed this

Thirtieth Day of November, 1993

Attest:

BRUCE LEHMAN

Attesting Officer

Commissioner of Patents and Trademarks